United States Patent
Kwack

(10) Patent No.: US 7,394,705 B2
(45) Date of Patent: Jul. 1, 2008

(54) INTERNAL VOLTAGE SUPPLIER FOR MEMORY DEVICE

(75) Inventor: Seung Wook Kwack, Daejeon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 18 days.

(21) Appl. No.: 11/156,030

(22) Filed: Jun. 17, 2005

(65) Prior Publication Data

US 2006/0104143 A1    May 18, 2006

(30) Foreign Application Priority Data

Nov. 15, 2004    (KR) .................. 10-2004-0093123

(51) Int. Cl.
*G11C 7/00*    (2006.01)
(52) U.S. Cl. .................... 365/189.09; 365/226; 365/191
(58) Field of Classification Search ................. 365/226, 365/230.06, 189.09, 191
See application file for complete search history.

(56) References Cited

U.S. PATENT DOCUMENTS 6,151,005 A * 11/2000 Takita et al. .................. 345/89
6,906,970 B2 * 6/2005 Kim et al. .................... 365/201
6,950,365 B2 * 9/2005 Jang et al. .................... 365/226
7,042,794 B2 * 5/2006 Kim ....................... 365/230.06
7,057,446 B2 * 6/2006 Choi et al. .................... 327/541
2003/0201673 A1 * 10/2003 Sim et al. ...................... 307/80
2004/0108890 A1 * 6/2004 Choi et al. .................... 327/541
2004/0170067 A1 * 9/2004 Kashiwazaki .......... 365/189.09

FOREIGN PATENT DOCUMENTS

| JP | 2001057098 | 2/2001 |
|---|---|---|
| KR | 1019970008159 | 5/1997 |
| KR | 1020030084170 | 11/2003 |

* cited by examiner

*Primary Examiner*—Thong Q Le
(74) *Attorney, Agent, or Firm*—Ladas & Parry LLP

(57) ABSTRACT

Disclosed is an internal voltage supplier for the memory device, the internal voltage supplier comprising: a first switching means for selecting one of a first voltage generated from an interior of the memory device and a second voltage applied from an exterior of the memory device; and a divider for receiving the first voltage or the second voltage selected by the first switching means and outputting a plurality of internal voltages.

6 Claims, 2 Drawing Sheets

INTERNAL VOLTAGE SUPPLIER FOR MEMORY DEVICE

BACKGROUND OF THE INVENTION

1. Field of the Invention

The present invention relates to an internal voltage supplier for a memory device, and more particularly to an internal voltage supplier for a memory device which can selectively receive power supply voltages supplied from the interior or exterior of the memory device, so as to provide the selected power supply voltage to the memory device.

2. Description of the Prior Art

As generally known in the art, a memory device operates by using a driving voltage Vdd applied from an exterior thereof. Recently, semiconductor memory devices have shown a tendency of having high integration and using lower power, so that the voltage level of a driving voltage Vdd applied to the memory device becomes lower and lower. However, when the driving voltage of a memory device is lowered, it is required to change the threshold voltage of a transistor, which consequently deteriorates the operation stability of the memory device. Therefore, it is important in a low-power high-integration memory device to provide stable voltage to the memory device. To this end, the conventional memory device uses an internal high-voltage generator, which is contained in the memory device, to provide a high voltage to an internal circuit requiring the high voltage.

However, the conventional memory device has a problem in that it frequently occurs that the voltage level of the high voltage generated from the internal voltage generator greatly changes depending on temperature change or a memory device fabricating process.

Also, in the conventional memory device, when an auto-precharge operation requiring the use of a high voltage is performed, it frequently occurs that the voltage level of the high voltage is temporarily dropped, which would cause a malfunction of the memory device. Such problems occur in other internal voltages of the memory device, too.

SUMMARY OF THE INVENTION

Accordingly, the present invention has been made to solve the above-mentioned problems occurring in the prior art, and an object of the present invention is to provide an internal voltage supplier for a memory device which can provide stable internal voltage to the memory device.

The present invention has an object to provide a device which receives a supply power directly from an exterior in order to generate an internal voltage of a memory device when power used in the memory device increases.

In accordance with a first aspect of the present invention in order to accomplish the above objects, there is provided an internal voltage supplier for the memory device, the internal voltage supplier comprising: a first switching means for selecting one of a first voltage generated from an interior of the memory device and a second voltage applied from an exterior of the memory device; and a divider for receiving the first voltage or the second voltage selected by the first switching means and outputting a plurality of internal voltages.

Herein, the first switching means is turned on/off by a code signal of a mode register set (MRS) or an extended mode register set (EMRS).

Herein, the first voltage and the second voltage have an equal voltage level, and current driving capability obtained with the second voltage is larger than that obtained with the first voltage.

Preferably, the internal voltage supplier further comprises a second switching means which selects one of the internal voltages outputted from the divider. Herein, the second switching means is turned on/off by a code signal of the MRS or the EMRS. In addition, it is preferred that the internal voltage supplier further comprises a control signal generation means which outputs a control signal for turning on/off the second switching means, wherein the control signal generation means generates the control signal by decoding the code signal of the MRS or the EMRS.

In accordance with a second aspect of the present invention in order to accomplish the above objects, there is provided an internal voltage supplier for the memory device, the internal voltage supplier comprising: a first voltage generation means for generating a first voltage; a second voltage generation means for generating a second voltage; a first switching means for selecting one of the first and second voltages in response to a first control signal; a divider for dividing a voltage selected by the first switching means into a plurality of voltage levels; a second switching means for selecting one of the multiple voltage levels outputted from the divider; and a decoder for generating a second control signal which turns on/off the second switching means on/off.

Herein, the first voltage generation means is disposed in the memory device and the second voltage generation means is disposed outside the memory device.

Herein, the first control signal is a code signal of a mode register set (MRS) or an extended mode register set (EMRS).

Herein, the decoder uses a code signal of the MRS or the EMRS in order to generate the second control signal.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
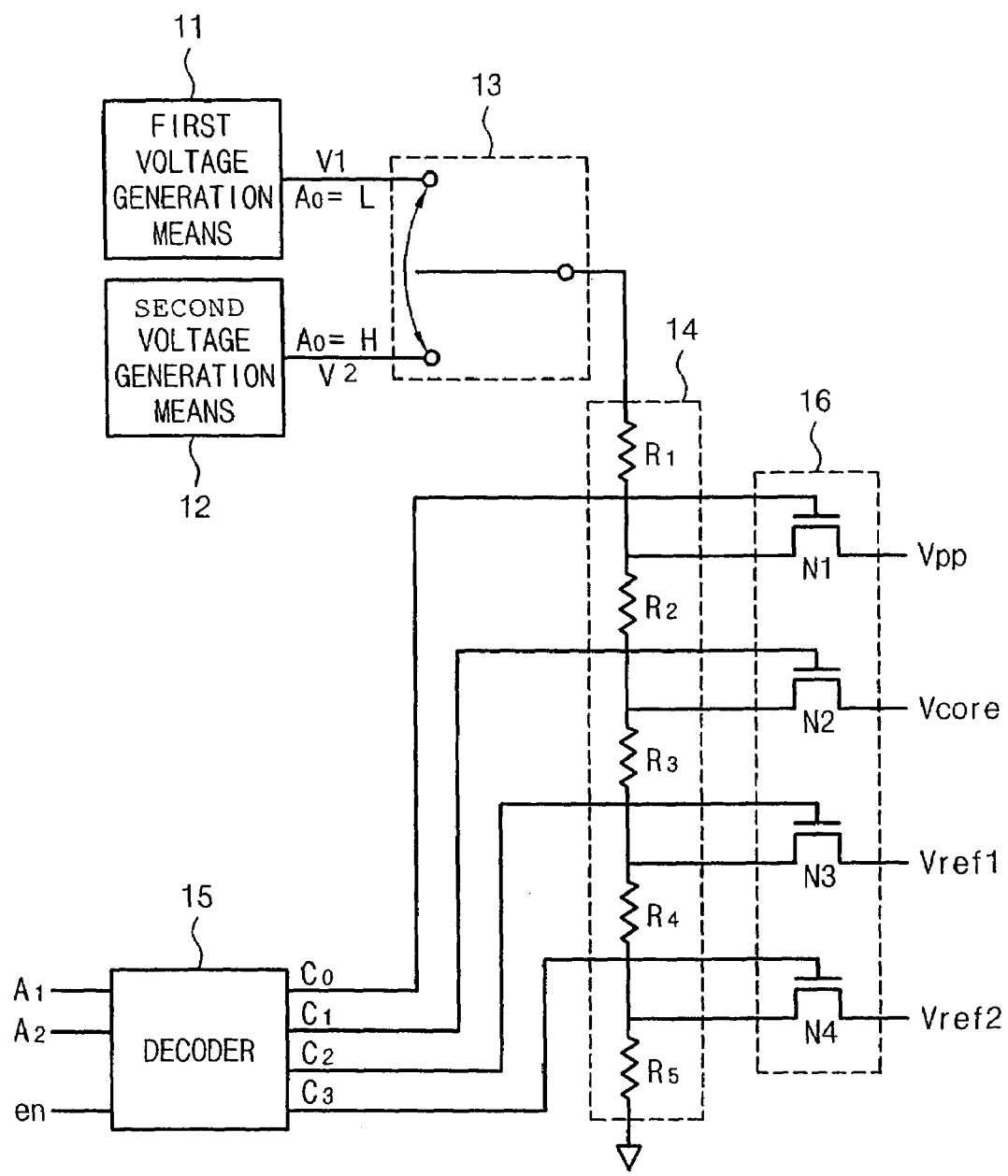
FIG. 1 is a block diagram illustrating an internal voltage supplier for a memory device according to an embodiment of the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIG. 1 is a block diagram illustrating an internal voltage supplier for a memory device according to an embodiment of the present invention.

The internal voltage supplier for the memory device includes a first and a second voltage generation means 11 and 12, a switching means 13, a divider 14, a decoder 15, and a switching section 16.

The first voltage generation means 11 is contained in the memory device, amplifies a driving voltage VDD applied to the memory device so as to generate a high voltage V1 higher than the driving voltage VDD. Herein, it is preferred that the high voltage V1 has a voltage level equal to or slightly higher than that of a high voltage VPP which is used to active the word lines of the memory device.

The second voltage generation means 12 represents a voltage source either contained in an external system connected to the memory device or provided from an external system. The second voltage generation means 12 generates a voltage V2 having a high current driving power. Herein, it is preferred that the voltage V2 has the same voltage level as the voltage V1. However, it is preferred that the current driving capability obtained with the voltage V2 is greater than that obtained with the voltage V1. That is, it is preferred that the current driving capability of the second voltage generation means is greater than that of the first voltage generation means. With such a construction, the second voltage generation means 12 can provide a stable power to an internal circuit of the memory device.

The switching means 13 includes a switch S and performs a switching operation by a control signal A0. The switch S is connected to the output node of the first voltage generation means 11 when the control signal A0 has a low level, and is connected to the output node of the second voltage generation means 12 when the control signal A0 has a high level. That is, the switching means 13 selects the power supply voltage V1 of the first voltage generation means 11 when the control signal A0 has a low level, and selects the power supply voltage V1 of the second voltage generation means 12 when the control signal A0 has a high level. Herein, the control signal A0 represents a logic level of an address A0 contained in a mode register set (MRS) or in an extended mode register set (EMRS). That is, the switching means 13 can select either the voltage V1 generated from the first voltage generation means 11 or the voltage V2 generated from the second voltage generation means 12, depending on the logic value of the address A0 contained the MRS or the EMRS.

The divider 14 includes a plurality of resistors R1, R2, R3, R4 and R5 connected in series between the output node of the switching means 13 and a ground node. One power supply voltage selected by the switching means 13 is divided into a plurality of voltages having various voltage levels according to resistor ratios among the resistors R1, R2, R3, R4 and R5.

The decoder 15, which is a control signal generation means, outputs control signals C0, C1, C2 and C3 for controlling turn-on/off of the switching section 16. The decoder 15 receives signals A1 and A2 and outputs four control signals C0, C1, C2 and C3. Herein, 'A1' and 'A2' are code signals stored in the MRS or the EMRS, and represent values of logic levels applied through corresponding pins A1 and A2, respectively. For reference, although an embodiment of the present invention uses a 2-bit signal (A1, A2) for controlling four switching elements N1 to N4 contained in the switching section 16, a 3-bit signal (A1, A2, A3) may be used to generate eight control signals C0 to C7 when the switching section 16 includes more switches. Herein, 'A3' is a code signal stored in the MRS or the EMRS, and represents the value of a logic level applied through a corresponding pin A3. An enable signal 'en' is a signal for determining whether to enable the decoder 15 or not. When one of the voltages V1 and V2 is applied to the divider 14 by the switching means 13, the decoder 15 reads the values of the signals A1 and A2 from the MRS or the EMRS to select and turn on one of the switching elements N1 to N4.

The switching section 16 includes four NMOS transistors N1, N2, N3 and N4, which are selectively turned on/off by the output signals C0, C1, C2 and C3 of the decoder 15. That is, when all of the output signals C0, C1, C2 and C3 have a high level, all of the NMOS transistors N1, N2, N3 and N4 are turned on. As a result, a plurality of voltages, which are divided by the divider 14 so as to have various voltage levels, are selected to provide a high voltage Vpp, a core voltage Vcore, and reference voltages Vref1 and Vref2 to the memory device. The voltages Vpp, Vcore, Vref1 and Vref2 may be variously used for internal circuits of the memory device. For example, the high voltage Vpp may be used to activate word lines of the memory device, the core voltage Vcore may be used as a voltage required for the operation of a memory cell array, and the reference voltages Vref1 and Vref2 may be used as reference voltages for other internal voltage generators.

Figure 2:
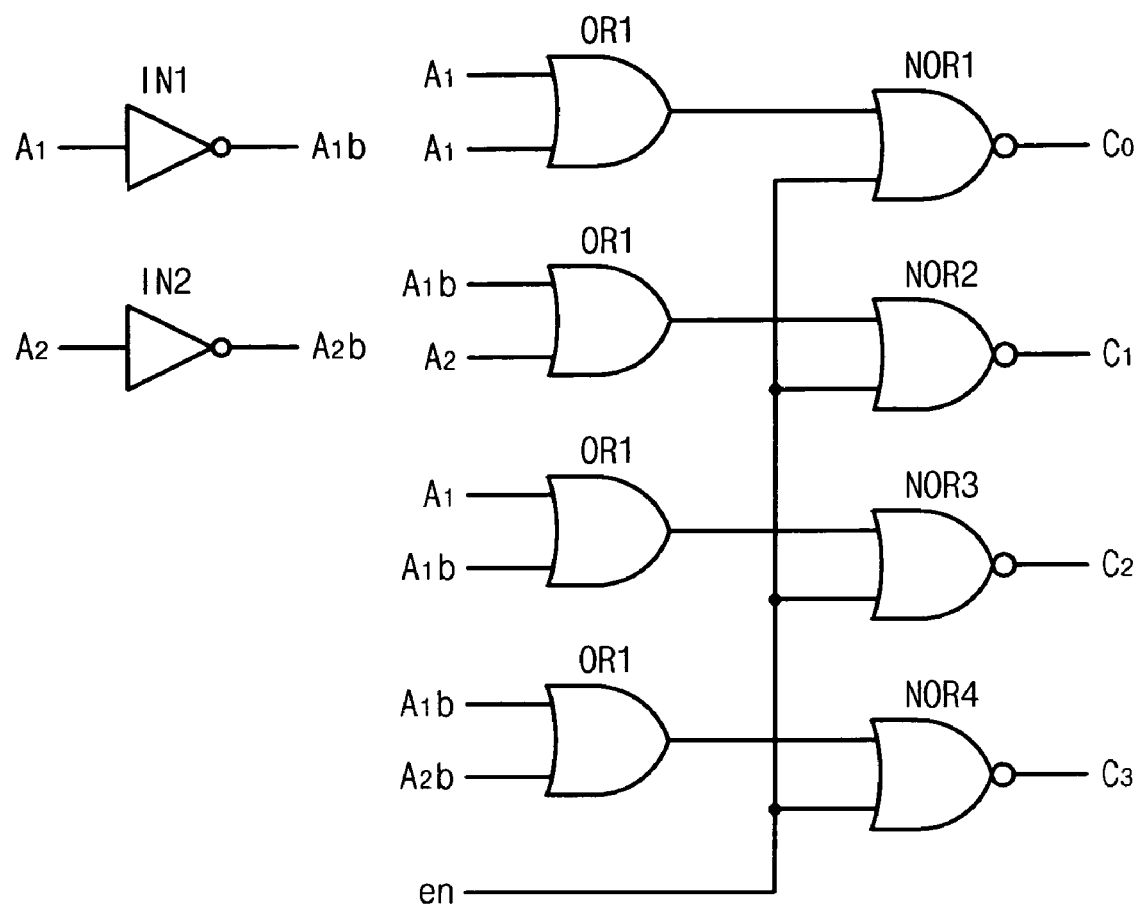
FIG. 2 is a circuit diagram illustrating a construction of the decoder of the internal voltage supplier for the memory device shown in FIG. 1.

FIG. 2 is a circuit diagram illustrating a construction of the decoder 15 of the internal voltage supplier for the memory device shown in FIG. 1.

According to an embodiment of the present invention, the decoder 15 of the internal voltage supplier for the memory device includes a plurality of OR gates OR1, OR2, OR3 and OR4 and a plurality of NOR gates NOR1, NOR2, NOR3 and NOR4. Each of the OR gates OR1, OR2, OR3 and OR4 exclusively receives a combination of one of the control signal A1 and an inverted signal A1b and one of control signal A2 and an inverted signal A2b. Herein, the signal A1b is a signal inverted from the control signal A1 by an inverter IN1, and the signal A2b is a signal inverted from the control signal A2 by an inverter IN2. The NOR gates NOR1, NOR2, NOR3 and NOR4 receive the output signals of the OR gates OR1, OR2, OR3 and OR4, respectively, and also receive an enable signal 'en' in common.

Hereinafter, the operation of the internal voltage supplier for the memory device according to an embodiment of the present invention will be described with the control signals A1 and A2 applied to the decoder 15.

First, when both of the control signals A1 and A2 have a low level, the decoder 15 outputs only the control signal C0 as a high level so as to transfer the control signal C0 of a high level to the switching section 16. As a result, only the NMOS transistor N1 of the switching section 16 is turned on to provide a high voltage Vpp to the memory device.

Next, when only the control signals A2 has a low level, the decoder 15 outputs only the control signal C1 as a high level so as to transfer the control signal C1 of a high level to the switching section 16. As a result, only the NMOS transistor N2 of the switching section 16 is turned on to provide a core voltage Vcore to the memory device.

In contrast, when the control signal A2 has a high level and the control signal A1 has a low level, only the control signal C2 of the decoder 15 is outputted as a high level to turn on only the NMOS transistor N3 of the switching section 16. As a result, the first reference voltage Vref1 is supplied to the interior of the memory device.

When both of the control signals A1 and A2 have a high level, only the control signal C3 of the decoder 15 is outputted as a high level. As a result, only the NMOS transistor N4 of the switching section 16 is turned on to supply the second reference voltage Vref2 to the memory device.

As described above, according to the internal voltage supplier for the memory device of the present invention, the switching means 13 selects either the power supply voltage V1 supplied from the interior of the memory device or the power supply voltage V2 supplied from an exterior depending on the control signal A0, and transfers the selected power supply voltage to the divider 14. When the switching means 13 selects the power supply voltage V2 supplied from an exterior and transfers the selected power supply voltage V2 to the divider 14, the level of the power supply voltage V2 changes to provide the high voltage Vpp, the core voltage Vcore, and the reference voltages Vref1 and Vref2 to the memory device. In other words, the internal voltage supplier for the memory device according to an embodiment of the present invention selects the power supply voltage V2 supplied from the exterior of the memory device and transfers the selected power supply voltage V2 to the memory device, when the power supply voltage V1 supplied from the interior is unstable due to a problem in the fabricating process of the memory device, temperature or an operational malfunction. Generally, since the voltage V2 has a larger current driving capability than the voltage V1, the voltage V2 may be efficiently used for the stable operation of the memory device.

As described above, according to the internal voltage supplier for the memory device of the present invention, power supply voltages supplied from the interior and exterior of the memory device are selectively received to provide an internal voltage to the memory device. Therefore, when a power supply voltage supplied from an exterior is selected and provided, it is possible to stably provide an internal voltage to the memory device. Accordingly, the operation of the memory device becomes stable, thereby preventing a malfunction of the memory device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A memory device comprising:
    a first voltage source generating a first voltage;
    a second voltage source external to the memory device and generating a second voltage that is different from the first voltage;
    a first switching circuit internal to the memory device, said first switching circuit having a first input, which is operatively coupled to the first voltage source and having a second input which is coupled to the second voltage source, said first switching circuit having an output and being configured to route at least one of the first and second voltages to a voltage divider, coupled to said output of said first switching circuit, in response to a first control signal;
    a voltage divider circuit, internal to the memory device and which is coupled to an output of the first switching circuit, said voltage divider dividing a voltage selected by the first switching circuit into a plurality of voltage levels;
    a second switching circuit, internal to the memory device, which selects one of the multiple voltage levels outputted from the divider; and
    a decoder, which generates a second control signal which controls the second switching circuit;
    wherein the first switching circuit is controlled by a code signal of a mode register set (MRS) or an extended mode register set (EMRS).

2. The memory device as claimed in claim 1, wherein the first voltage and the second voltage have an equal voltage level, said second voltage has a current driving capability larger than the first voltage.

3. The memory device as claimed in claim 1, wherein the second switching circuit is controlled by a code signal of the MRS or the EMRS.

4. The memory device as claimed in claim 1, further comprising a control signal generation circuit, which outputs a control signal for controlling the second switching circuit,
    wherein the control signal generation circuit generates the control signal by decoding the code signal of the MRS or the EMRS.

5. The memory device as claimed in claim 1, wherein the first control signal is a code signal of a mode register set (MRS) or an extended mode register set (EMRS).

6. The memory device as claimed in claim 1, wherein the decoder uses a code signal of the MRS or the EMRS in order to generate the second control signal.

* * * * *